United States Patent
Ho et al.

(10) Patent No.: US 11,990,365 B2
(45) Date of Patent: May 21, 2024

(54) METHOD FOR MANUFACTURING SEMICONDUCTOR DEVICE

(71) Applicant: Winbond Electronics Corp., Taichung (TW)

(72) Inventors: Chang-Ju Ho, Taichung (TW); Kao-Tsair Tsai, Taichung (TW); Ying-Hao Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 141 days.

(21) Appl. No.: 17/540,552

(22) Filed: Dec. 2, 2021

(65) Prior Publication Data

US 2022/0172986 A1  Jun. 2, 2022

(30) Foreign Application Priority Data

Dec. 2, 2020 (TW) ................. 109142374

(51) Int. Cl.
*H01L 21/768* (2006.01)
*H01L 21/311* (2006.01)

(52) U.S. Cl.
CPC .. *H01L 21/76808* (2013.01); *H01L 21/76813* (2013.01); *H01L 21/76816* (2013.01); *H01L 21/31116* (2013.01); *H01L 21/76834* (2013.01)

(58) Field of Classification Search
CPC ......... H01L 21/76808; H01L 21/76813; H01L 21/76816; H01L 21/31116; H01L 21/76834
See application file for complete search history.

(56) References Cited

U.S. PATENT DOCUMENTS

| 6,107,185 | A  | * | 8/2000 | Lukanc ............... H01L 21/7684 |
|  |  |  |  | 438/626 |
| 6,235,629 | B1 | * | 5/2001 | Takenaka .......... H01L 21/76808 |
|  |  |  |  | 438/618 |
| 9,412,648 | B1 | * | 8/2016 | Shiu .................. H01L 21/76816 |
| 2004/0100779 | A1 | * | 5/2004 | Kraft ................. H01L 21/76808 |
|  |  |  |  | 257/E21.579 |
| 2006/0163739 | A1 |  | 7/2006 | Komai et al. |

FOREIGN PATENT DOCUMENTS

| CN | 103515301 A | 1/2014 |
| TW | 201005028 A | 2/2010 |
| TW | 201737312 A | 10/2017 |

* cited by examiner

*Primary Examiner* — Dale E Page
*Assistant Examiner* — Quovaunda Jefferson
(74) *Attorney, Agent, or Firm* — MUNCY GEISSLER OLDS & LOWE P.C.

(57) ABSTRACT

A method for manufacturing a semiconductor device includes forming a metal layer in a substrate and sequentially forming a barrier layer and an insulating layer on the substrate. The method includes performing a first etching step to form an opening in the insulating layer, and the opening does not expose the barrier layer. After the first etching step, a gap-filling layer is formed on the insulating layer and fills the opening. The method includes performing a second etching step to form a first via communicating with the opening in the gap-filling layer, and an upper portion of the opening is widened to form a trench. The method includes performing a third etching step to remove the gap-filling layer in a bottom of the opening and to deepen both the trench and the opening. The method includes forming a second via communicating with the opening to expose the metal layer.

13 Claims, 5 Drawing Sheets

METHOD FOR MANUFACTURING SEMICONDUCTOR DEVICE

CROSS REFERENCE TO RELATED APPLICATIONS

This Application claims priority of Taiwan Patent Application No. 109142374, filed on Dec. 2, 2020, the entirety of which is incorporated by reference herein.

BACKGROUND OF THE INVENTION

Field of the Invention

The present invention relates to a semiconductor device, and in particular it relates to a method of manufacturing a semiconductor device using a dual damascene process.

Description of the Related Art

In the manufacturing process of semiconductor devices, in order to connect a semiconductor element to the control circuit, an interconnect structure is formed on the semiconductor element. The interconnect structure is a multi-layered structure, which includes insulating layers and metal layers formed in the insulating layers. In the process of forming the interconnect structure, the insulating layer is usually etched to form vias or trenches. Then, metal is filled into the vias or the trenches to form conductive plugs or conductive wires, respectively.

The dual damascene process is often used to form interconnect structures. Depending on the order in which vias and trenches are formed, the dual damascene process is either a via-first process or a trench-first process. The size of the via is smaller than the trench, and the lithography process for forming the via is more difficult than the lithography process for forming the trench. In the via-first process, a lithography process is performed for forming the vias on a flat surface. Therefore, compared with the trench-first process, the process control of the via-first process is easier, and the process window is larger.

In order to form an interconnect structure with a multi-layered structure, the dual damascene process can be repeated several times. More specifically, after forming the first metal layer (for example, conductive plugs and/or conductive wires) in the first insulating layer, a barrier layer is formed on the first metal layer. Then, a second insulating layer is formed on the barrier layer. When the second insulating layer is etched to form the vias, the barrier layer can be used as an etching stop layer. In other words, the etching process will stop after the barrier layer is exposed.

In a conventional via-first process, in order to prevent the metal in the metal layer from leaking out and causing pollution during the manufacturing process, the surface of the metal layer is covered with the above-mentioned barrier layer. However, the thermal expansion coefficient of the barrier layer and the thermal expansion coefficient of the metal layer generally do not match. When receiving the heat energy in the manufacturing process, the stress caused by the mismatch of the thermal expansion coefficients will cause protrusions on the surface of the metal layer, so that the surface of the barrier layer covering the surface of the metal layer is also not flat. Furthermore, the size, number, and positions of the protrusions of the metal layer cannot be controlled. Therefore, when the conventional via-first dual damascene process is performed, the protrusions of the metal layer may be exposed during the etching process for forming the vias. In addition, the barrier layer on the protrusion of the metal layer may be affected by stress and change its molecular arrangement. Therefore, the etching rate of the barrier layer may be increased, and the underlying metal layer may be exposed. As a result, the metal (for example, copper) in the metal layer may leak out and be scattered in the insulating layer, on the surface of the substrate, in the processing chamber and/or in the gas pipeline, causing uncontrollable pollution. Therefore, the yield and reliability of product are reduced.

In order to solve the above-mentioned pollution problem caused by metal, in the conventional dual damascene process, the following methods are adopted to avoid the formation of protrusions of the metal layer. In some conventional technologies, before forming the barrier layer, a pre-treatment process, such as pre-anneal, is performed on the metal layer. In other conventional technologies, a gas (for example, hydrogen, nitrogen, or a mixed gas of hydrogen and nitrogen) is introduced when the metal layer is pre-annealed. In other conventional technologies, before forming the barrier layer, the surface of the metal layer is treated by using a silicon-containing precursor (for example, $SiH_4$). However, none of these methods can completely avoid the generation of protrusions on the surface of the metal layer. Even if the number of protrusions can be reduced, these methods may increase the electrical resistance value of the metal layer, which is disadvantageous for the operation of the semiconductor device.

On the other hand, in a conventional via-first process, during the etching process for forming the via, it is necessary to completely remove the insulating layer at the bottom of the via. When the barrier layer is subsequently removed, if the insulating layer at the bottom of the via is not completely removed, the surface of the metal layer may not be completely exposed, which may result in excessively high electrical resistance or failure of the conductive plug. In order to avoid this problem, in the conventional via-first process, the insulating layer is usually over-etched to ensure that the barrier layer can be exposed. However, in order to avoid the pollution problem caused by metal, the barrier layer cannot be etched through during the etching process for forming the via. Therefore, it is very difficult to control the etching process. When the device is miniaturized (that is, the thickness of the barrier layer becomes thinner), the control of the etching process will become more difficult.

Therefore, in this technical field, there is still a need for a semiconductor device with high yield and high reliability and a method of manufacturing such a semiconductor device.

BRIEF SUMMARY OF THE INVENTION

The disclosure provides a method for manufacturing a semiconductor device, which can avoid the problem of metal pollution associated with the conventional via-first process.

In accordance with some embodiments of the present disclosure, a method for manufacturing a semiconductor device is provided. The method includes forming a metal layer in a substrate and forming a barrier layer on the substrate. The barrier layer covers the metal layer. The method includes forming an insulating layer on the barrier layer and performing a first etching step to form an opening in the insulating layer. After the first etching step, the opening does not expose the barrier layer. The method includes forming a gap filling layer on the insulating layer and filling the opening after the first etching step. The gap filling layer has a flat top surface. The method includes performing a second etching step to form a first via communicating with the opening in the gap filling layer. The method includes removing a portion of the insulating layer to widen the upper portion of the opening to form a trench. After the second etching step, a portion of the gap filling layer is located at the bottom of the opening. The method includes performing a third etching step to remove the gap filling layer at the bottom of the opening and deepening the trench and the opening. The method includes forming a second via communicating with the opening in the barrier layer to expose the metal layer.

In the method for manufacturing a semiconductor device provided by the embodiment of the present invention, by controlling the etching depth in the first etching step, it is possible to avoid exposing the metal layer before the third etching step. Therefore, the pollution caused by metal can be avoided, and the yield and reliability of the semiconductor device can be significantly improved.

DETAILED DESCRIPTION OF THE INVENTION

Figure 1A:
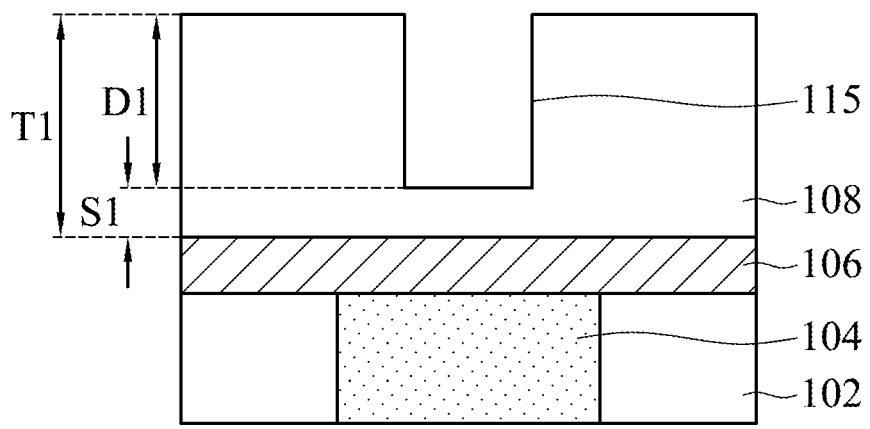
FIG. 1A to FIG. 1E are cross-sectional views corresponding to various steps of manufacturing a semiconductor device in accordance with some embodiments of the present invention.

The present disclosure is best understood from the following detailed description when read with the accompanying figures. Furthermore, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

A method for manufacturing a semiconductor device is provided in the embodiment of the present invention. FIG. 1A to FIG. 1E are cross-sectional views corresponding to various steps of manufacturing a semiconductor device 100 in accordance with some embodiments of the present invention.

Referring to FIG. 1A, a metal layer 104 is formed in the substrate 102. More specifically, an opening or a trench may be formed in the substrate 102, and then a metal material may be filled into the opening or the trench. Next, a planarization process (for example, a chemical mechanical polishing process) is performed to remove excess metal materials. After the planarization process, the substrate 102 and the metal layer 104 have a flat top surface.

The material of the substrate 102 may include silicon, gallium arsenide, gallium nitride, germanium silicide, silicon on insulator (SOI), other suitable materials, or a combination thereof. In the present embodiment, the substrate 102 is a silicon substrate. In some embodiments, other structures may also be formed in the substrate 102, for example, isolation structures, p-type implant regions, or n-type implant regions (not shown). The material of the metal layer 104 may include copper, aluminum, silver, gold, or other suitable metals. In the present embodiment, the metal layer 104 is copper. The metal layer 104 may be formed by a suitable deposition process, for example, a chemical vapor deposition (CVD) process, an atomic layer deposition process, an electroplating process, or a combination thereof.

Next, a barrier layer 106 is formed on the substrate 102, and the barrier layer 106 covers the metal layer 104. Then, an insulating layer 108 is formed on the barrier layer 106. The barrier layer 106 can prevent the metal in the metal layer 104 from leaking out during the manufacturing process and can prevent the pollution caused by metal. The material of the barrier layer 106 may include nitride, carbonitride, or other suitable barrier materials. In the present embodiment, the barrier layer 106 is silicon carbonitride (SiCN). The material of the insulating layer 108 may include oxide, nitride, oxynitride, other suitable insulating materials, or a combination thereof. In the present embodiment, the insulating layer 108 is silicon oxide. The barrier layer 106 and the insulating layer 108 may be formed by a suitable deposition process, independently, for example, a CVD process, a physical vapor deposition process, or other suitable deposition processes.

Next, a first etching step is performed to form an opening 115 in the insulating layer 108. In some embodiments, after the first etching step, the opening 115 does not expose the barrier layer 106, as shown in FIG. 1A. The first etching step may include an anisotropic etching step. In the present embodiment, the first etching step is a dry etching step.

Figure 1B:
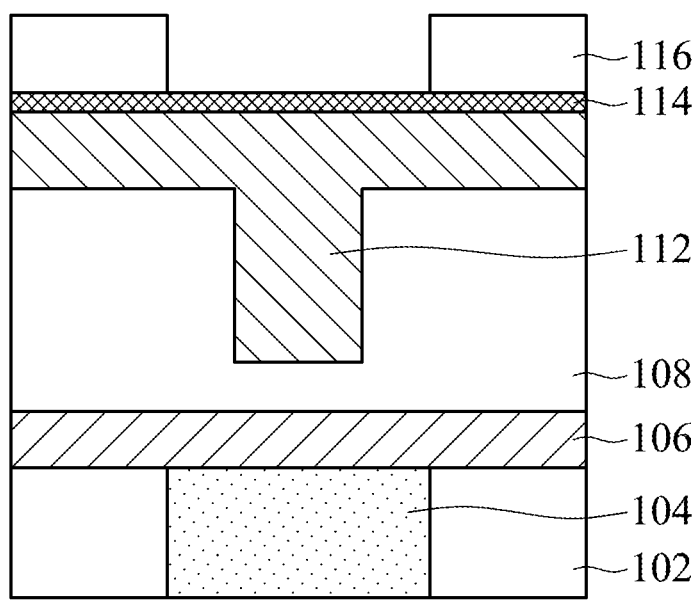

Referring to FIG. 1B, after the first etching step, a gap filling layer 112 is formed on the insulating layer 108 to fill the opening 115. The gap filling layer 112 has a flat top surface. Next, a mask layer 114 is formed on the gap filling layer 112, and a patterned photoresist layer 116 is formed on the mask layer 114. The position of the opening of the patterned photoresist layer 116 corresponds to the position of the opening 115, and the diameter of the opening of the patterned photoresist layer 116 is larger than the diameter of the opening 115 to expose the mask layer 114 located on the gap filling layer 112 filled in the opening 115. In some embodiments, the gap filling layer 112 is a material with good fluidity, and the gap filling layer 112 has a flat top surface. Therefore, the mask layer 114 and the patterned photoresist layer 116 each independently have a substantially uniform thickness. Furthermore, the thickness of the patterned photoresist layer 116 may be the same as the thickness of the photoresist layer in a general lithography process. As a result, the production efficiency can be improved.

In some embodiments, the gap filling layer 112, the mask layer 114, and the patterned photoresist layer 116 may be a photoresist stack structure which is commonly used in the lithography process. For example, the gap filling layer 112 may include a bottom anti-reflective coating (BARC) material. In some embodiments, the gap filling layer 112 may be an organic anti-reflective material or an inorganic anti-reflective material, such as, silicon oxycarbide (SiOC). For example, the mask layer 114 may be a silicon-rich bottom anti-reflective coating (Si-rich BARC) material. In some embodiments, the mask layer 114 may be silicon-rich silicon oxide, silicon-rich silicon oxynitride, or silicon-rich silicon oxycarbide. The patterned photoresist layer 116 may include general photoresist materials. It should be noted that the present invention does not limit the photoresist stack structure to only be composed of three layers, and the number of layers of the mask layer 114 may be adjusted according to the requirements of the lithography process and the subsequent etching process.

Figure 1C:
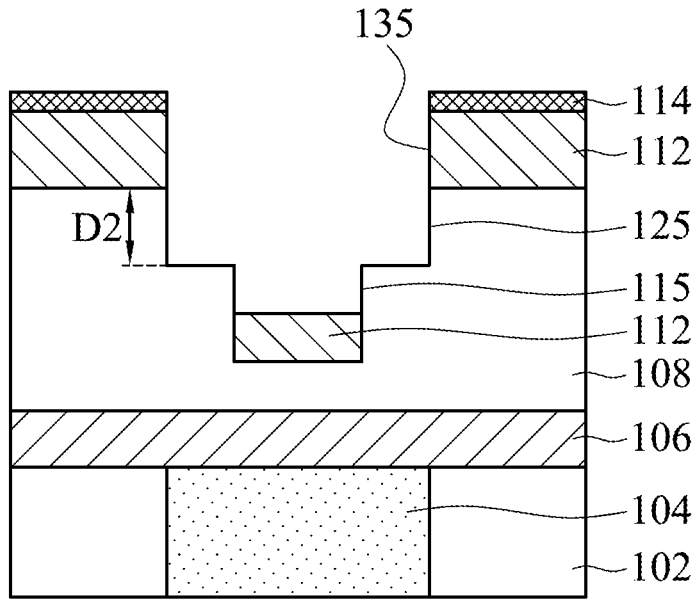

Referring to FIG. 1C, a second etching step is performed by using the patterned photoresist layer 116 as a mask to remove a portion of the mask layer 114, a portion of the gap filling layer 112, and a portion of the insulating layer 108. After the second etching step, a first via 135 communicating with the opening 115 is formed in the gap filling layer 112, and the upper portion of the opening 115 is widened to form a trench 125. Furthermore, after the second etching step is completed, there is still a remaining gap filling layer 112 at the bottom of the opening 115, and the top surface of the remaining gap filling layer 112 is lower than the bottom surface of the trench 125. The second etching step may include an anisotropic etching step. In the present embodiment, the second etching step is a dry etching step.

Figure 1D:
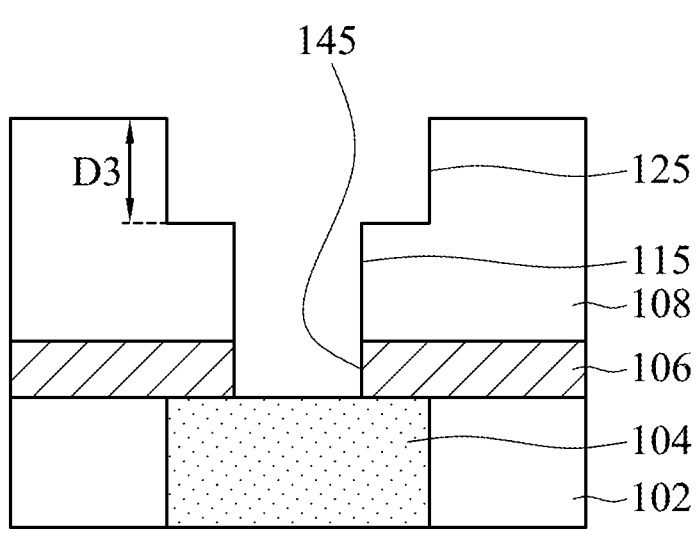

Referring to FIG. 1D, a third etching step is performed to remove the gap filling layer 112 remaining at the bottom of the opening 115. During the third etching step, the depth of the bottom surface of the trench 125 and the depth of the bottom surface of the opening 115 are deepened at the same time, and then, the barrier layer 106 exposed by the opening 115 is removed to expose the metal layer 104. After the third etching step, a second via 145 communicating with the opening 115 is formed in the barrier layer 106. In the present embodiment, while removing the barrier layer 106 exposed by the opening 115, the depth of the bottom surface of the trench 125 can be deepened again. As a result, it is easy to control the depth of the bottom surface of the trench 125 to the third depth D3. The third etching step may include an anisotropic etching step. In the present embodiment, the third etching step is a dry etching step.

Figure 1E:
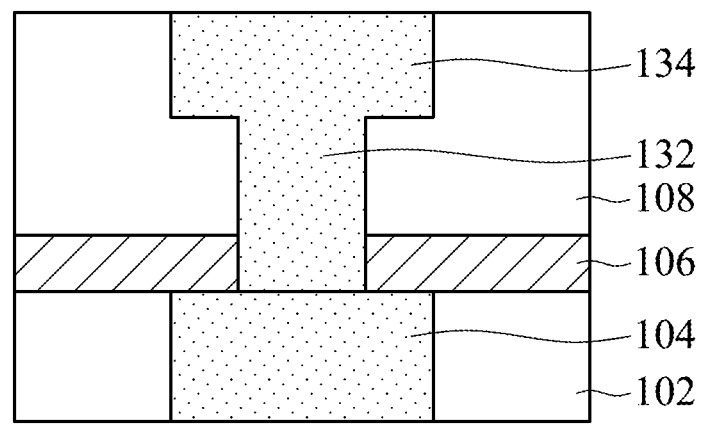

Referring to FIG. 1E, the opening 115, the trench 125 and the second via 145 are filled with a metal material. Then, a planarization process (for example, a chemical mechanical polishing process) is performed to remove the excess metal materials. After the planarization process, the conductive wire 134 is formed in the trench 125, the conductive plug 132 is formed in the opening 115 under the trench 125, and the top surface of the conductive wire 134 and the top surface of the insulating layer 108 are coplanar. The material and forming method of the conductive plug 132 and the conductive wire 134 may be the same as or similar to the material and forming method of the metal layer 104, and will not be described in detail here.

After that, other conventional processes may be performed to complete the semiconductor device 100. For example, the process shown in FIG. 1A to FIG. 1E may be repeated one or more times according to actual needs. As result, an interconnect structure with a multi-layered structure can be formed.

In the manufacturing method of the semiconductor device 100 provided in the present embodiment, by controlling the etching depth in the first etching step, it is possible to avoid exposing the metal layer before the third etching step. Such a method can significantly improve the yield and reliability of the semiconductor device, and will not significantly increase the complexity of the manufacturing process and the production cost.

Referring to FIG. 1A, after the first etching step, the barrier layer 106 is not exposed by the opening 115. As a result, even if protrusions are generated on the surface of the metal layer 104, it can still be avoided that the metal layer is exposed before the third etching step. The depth of the opening 115 can be adjusted by controlling the etching parameters of the first etching step (such as, the etching gas, the etching time, the etching power, and so on). For example, argon, oxygen, nitrogen, carbon monoxide, carbon-hydrogen-fluorine-containing gas or a combination of thereof may be used as the etching gas, and the etching time may be controlled between about 10 seconds and about 300 seconds. In some embodiments, the insulating layer 108 has a first thickness T1, and after the first etching step, the opening 115 has a first depth D1. In order to make the control of the subsequent third etching step easier, the ratio T1/D1 of the first thickness T1 to the first depth D1 may be 1.0-2.0. In some embodiments, the bottom surface of the opening 115 formed after the first etching step and before the second etching step has the minimum distance S1 from the top surface of the barrier layer 106, and the minimum distance S1 is 50-500 nm. In order to make the control of the subsequent third etching step easier, the ratio T1/S1 of the first thickness T1 to the minimum distance S1 may be 5.0-20.0.

Referring to FIG. 1C, after the second etching step, a portion of the gap filling layer 112 remains at the bottom of the opening 115. During the second etching step, the etching rate of the insulating layer 108 may be the same as or similar to the etching rate of the gap filling layer 112. Therefore, the profile of the opening 115 and the trench 125 can be well controlled. The etching rate of the insulating layer 108 and the etching rate of the gap filling layer 112 can be adjusted by controlling the etching parameters of the second etching step (such as, the etching gas, the etching time, the etching power, and so on). In some embodiments, during the second etching step, the ratio R1/R2 of the etching rate R1 of the insulating layer 108 to the etching rate R2 of the gap filling layer 112 is 0.5-3.0.

Referring to FIG. 1D, in the present embodiment, after the third etching step, the barrier layer 106 at the bottom of the opening 115 is removed to expose the metal layer 104. During the third etching step, the etching rate of the insulating layer 108 may be the same as or similar to the etching rate of the barrier layer 106. Therefore, the barrier layer 106 at the bottom of the opening 115 can be completely removed. The etching rate of the insulating layer 108 and the barrier layer 106 can be adjusted by controlling the etching parameters of the third etching step (such as, the etching gas, the etching time, the etching power, and so on). In the present embodiment, during the third etching step, the ratio R3/R4 of the etching rate R3 of the insulating layer 108 to the etching rate R4 of the barrier layer 106 is 0.5-3.0.

In another embodiment (not shown), the third etching step is performed by using the barrier layer 106 as an etching stop layer. After the third etching step, the barrier layer 106 at the bottom of the opening 115 is not completely removed. In such an embodiment, after the third etching step, a fourth etching step may be performed to remove the barrier layer 106 at the bottom of the opening 115. After the fourth etching step, the opening 115 exposes the metal layer 104, as shown in FIG. 1D. In such an embodiment, during the third etching step, the etching rate of the insulating layer 108 may be much greater than the etching rate of the barrier layer 106. Therefore, the barrier layer 106 can be used as an etch stop layer for the third etching step. Furthermore, in the fourth etching step, the etching rate of the barrier layer 106 may be much greater than the etching rate of the insulating layer 108. Therefore, the profile of the opening 115 and the trench 125 can be well controlled, and it can be ensured that the barrier layer 106 at the bottom of the opening 115 is completely removed. The etching rate of the insulating layer 108 and the etching rate of the barrier layer 106 can be adjusted by controlling the etching parameters of the third etching step and the fourth etching step (such as, the etching gas, the etching time, the etching power, and so on). In such an embodiment, during the third etching step, the ratio R5/R6 of the etching rate R5 of the insulating layer 108 to the etching rate R6 of the barrier layer 106 is 3.0-20.0, and during the fourth etching step, the ratio R7/R8 of the etching rate R7 of the barrier layer 106 to the etching rate R8 of the insulating layer 108 is 3.0-20.0.

Referring to FIG. IC, after performing the second etching step and before performing the third etching step, the trench 125 has a second depth D2. Referring to FIG. 1D, after the third etching step, the trench 125 has a third depth D3. In some embodiments, the ratio D3/D2 of the third depth D3 to the second depth D2 is 1.2-2.0. As a result, the profile of the opening 115 and the trench 125 can be well controlled, and the trench 125 can have a sufficiently large depth, so that the electrical resistance value of the conductive wire 134 is low.

FIG. 2A to FIG. 2D are cross-sectional views corresponding to various steps of manufacturing a semiconductor device 200 in accordance with other embodiments of the present invention. In FIG. 2A to FIG. 2D, the same reference numerals are used to denote the same elements as those shown in FIG. 1A to FIG. 1D. In order to simplify the description, the elements that are the same as those shown in FIG. 1A to FIG. 1D and the forming process steps thereof will not be described in detail here.

Figure 2A:
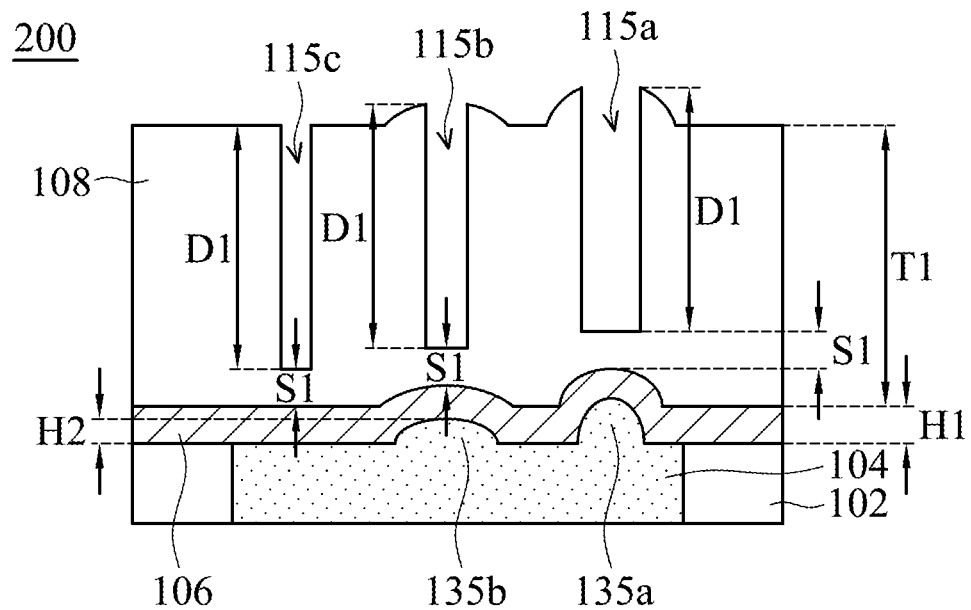
FIG. 2A to FIG. 2D are cross-sectional views corresponding to various steps of manufacturing a semiconductor device in accordance with other embodiments of the present invention.

FIG. 2A is similar to FIG. 1A, and the difference is that the metal layer 104 in FIG. 2A has two protrusions. In other words, FIG. 2A to FIG. 2D illustrate an embodiment in which the metal layer has a plurality of protrusions. In the present embodiment, the thermal expansion coefficient of the barrier layer 106 is smaller than the thermal expansion coefficient of the metal layer 104. In some embodiments, the metal layer 104 has a first thermal expansion coefficient, the barrier layer 106 has a second thermal expansion coefficient, and the ratio of the first thermal expansion coefficient to the second thermal expansion coefficient is 9.0-15.0.

In some embodiments, referring to FIG. 2A, before the first etching step is performed, the first protrusion 135a has a first height H1. The second protrusion 135b has a second height H2, and the second height H2 is smaller than the first height H1. Then, the first etching step is performed to form the first opening 115a, the second opening 115b, and the third opening 115c in the insulating layer 108. The first opening 115a is located above the first protrusion 135a, and the second opening 115b is located above the second protrusion 135b.

As shown in FIG. 2A, the barrier layer 106 which is conformally formed on the metal layer having the protrusion has an uneven surface. Furthermore, in one embodiment, the insulating layer 108 also has an uneven top surface. In the manufacturing method of the semiconductor device provided by the embodiment of the present invention, the depth of the opening formed in the first etching step can be determined according to the height of the protrusion. Therefore, it is possible to avoid exposing the metal layer before performing the third etching step. More specifically, the height of each protrusion on one of the multiple wafers using the same process can be measured by a transmission electron microscope, and the maximum height can be determined. Then, the depth of the opening after the first etching step is determined according to the maximum height of the protrusion.

In the present embodiment, after the first etching step, the maximum height of the protrusion is the first height H1, as shown in FIG. 2A. There is a minimum distance S1 between the bottom surface of the first opening 115a (the second opening 115b or the third opening 115c) and the top surface of the barrier layer 106. The ratio S1/H1 of the minimum distance S1 to the maximum height H1 is 0.5-5.0. In some embodiments, the minimum distance S1 is 50-500 nm. In some embodiments, the insulating layer 108 has a first thickness T1. After the first etching step, the first opening 115a (the second opening 115b or the third opening 115c) has a first depth D1. The ratio T1/D1 of the first thickness T1 to the first depth D1 is 1.0-2.0. The ratio T1/S1 of the first thickness T1 to the minimum distance S1 may be 5.0-20.0. Therefore, after the first etching step, the barrier layer 106 will not be exposed.

Figure 2B:
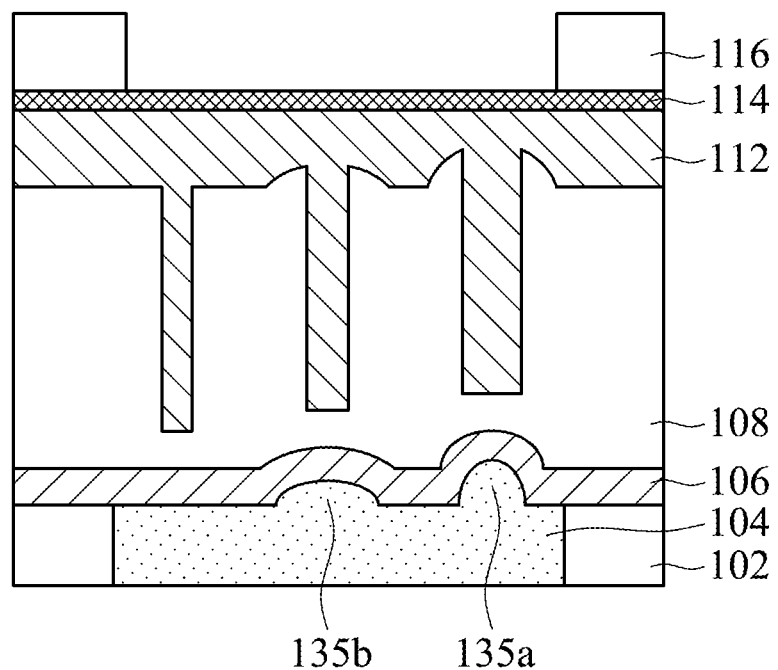
Figure 2C:
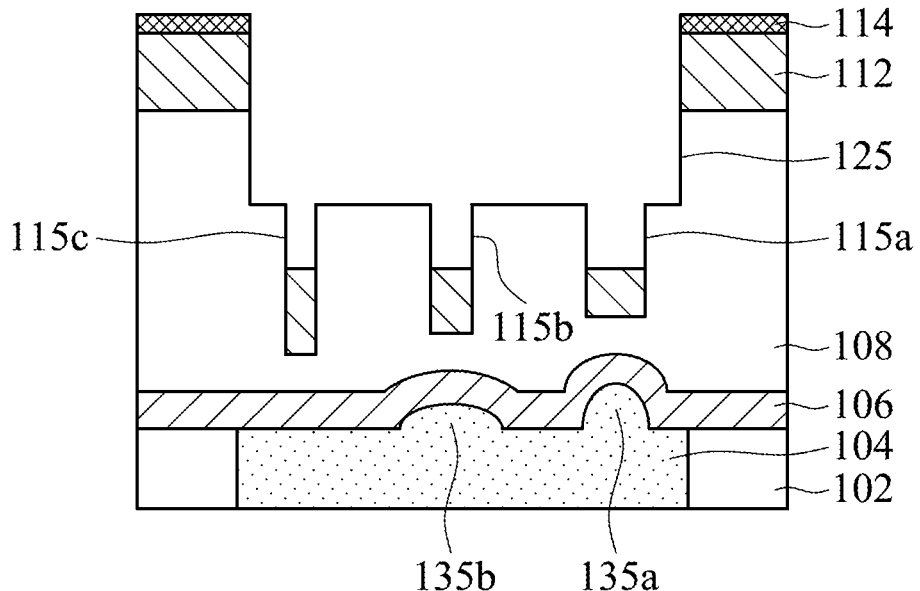
Figure 2D:
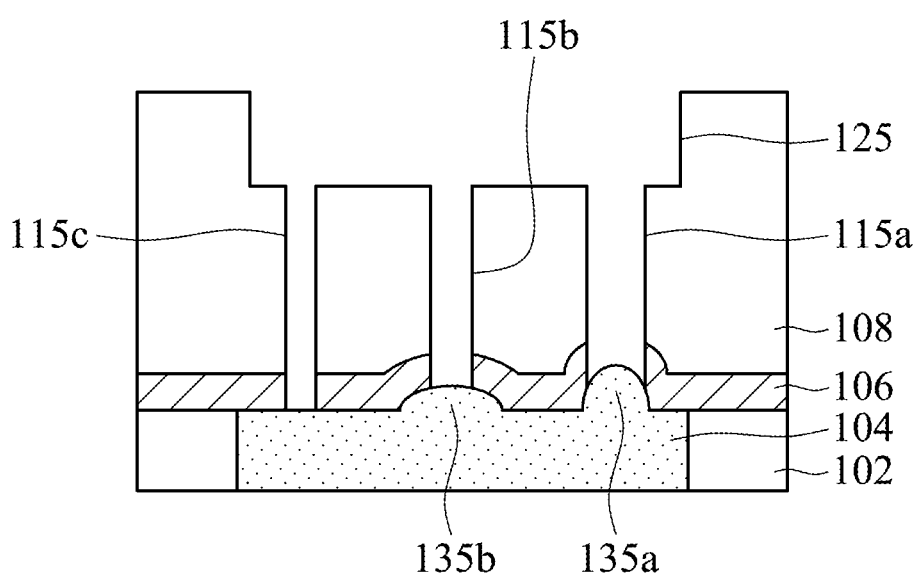

FIG. 2B to FIG. 2D are respectively similar to FIG. 1B to FIG. ID, and the difference is that the positions of the openings of the patterned photoresist layer 116 simultaneously correspond to the positions of the first opening 115a, the second opening 115b, and the third opening 115c, and the diameter of the opening of the patterned photoresist layer 116 is larger than the sum of the diameters of the first opening 115a, the second opening 115b, and the third opening 115c.

Referring to FIG. 2C, the second etching step is performed to form a trench 125 communicating with the first opening 115a, the second opening 115b, and the third opening 115c at the same time. Furthermore, during the second etching step, the etching rate of the insulating layer 108 may be the same as or similar to the etching rate of the gap filling layer 112. Therefore, in the present embodiment, after the second etching step, the top surfaces of the gap filling layers 112 remaining in the first opening 115a, the second opening 115b, and the third opening 115c are coplanar with one another.

Referring to FIG. 2D, the third etching step is performed to remove the barrier layers 106 at the bottom of the first opening 115a, the second opening 115b, and the third opening 115c, such that the metal layer 104 is exposed.

In another embodiment, after the third etching step, the barrier layers 106 located in the first opening 115a, the second opening 115b, and the third opening 115c are not removed. Subsequently, a fourth etching step may be performed to remove the barrier layers 106 at the bottom of the first opening 115a, the second opening 115b and the third opening 115c, such that the metal layer 104 is exposed.

After that, other conventional processes may be performed to complete the semiconductor device 200. For example, the process shown in FIG. 1E may be performed to form the conductive plugs and the conductive wires. Furthermore, an interconnect structure with a multi-layered structure can be formed.

It should be understood that the number, size, and relative position of the protrusions shown in FIG. 2A are only for illustration and are not intended to limit the present invention. For example, in other embodiments, one protrusion may be located directly under the plurality of openings (that is, the area of the protrusion is larger than the area of the opening).

In summary, in the manufacturing method of the semiconductor device provided by the embodiment of the present invention, by retaining a portion of the insulating layer at the bottom of the opening formed in the first etching step, it is possible to avoid exposing the metal layer before performing the third etching step. Therefore, the pollution caused by metal can be avoided, and the yield and reliability of the semiconductor device can be significantly improved. Furthermore, in the manufacturing method of the semiconductor device provided by the embodiment of the present invention, only the etching depth in the first etching step needs to be adjusted to avoid the pollution caused by metal. In addition, in the manufacturing method of the semiconductor device provided by the embodiment of the present invention, even if the protrusion is formed in the metal layer, the pollution caused by the metal can still be avoided. In other words, before forming the barrier layer, there is no need to perform a pre-treatment process on the metal layer. Therefore, such a manufacturing method can be easily integrated into an existing manufacturing process without additional replacement or modification of production equipment. As a result, the production cost and the complexity of the manufacturing process will not be significantly increased.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a semiconductor device, comprising:
   forming a metal layer in a substrate;
   conformally forming a barrier layer on the substrate and covering the metal layer, wherein the barrier layer has an uneven top surface with a plurality of protrusions;
   forming an insulating layer on the barrier layer;
   performing a first etching step to form a plurality of openings in the insulating layer, wherein during the first etching step, a depth of the openings is controlled to avoid the openings exposing the barrier layer having the uneven top surface by controlling at least one etching parameter of the first etching step;
   after the first etching step, forming a gap filling layer on the insulating layer and filling the opening, wherein the gap filling layer has a flat top surface;
   forming a mask layer on the gap filling layer, and then forming a patterned photoresist layer on the mask layer to expose the mask layer located on the gap filling layer;
   performing a second etching step on the mask layer, the gap filling layer and the insulating layer using the patterned photoresist layer as a mask to form a first via in the gap filling layer, and widening an upper portion of the openings to form a trench in the insulating layer communicating between the openings and the first via using the gap filling layer having the first via as a mask, wherein after the second etching step, a portion of the gap filling layer is located at a bottom of the openings;
   performing a third etching step to remove the gap filling layer at the bottom of the openings and increasing a depth of the trench and the depth of the openings; and
   forming a plurality of second vias communicating with the openings in the barrier layer having the uneven top surface to expose the metal layer, wherein the exposed surfaces of the metal layer are not leveled.

2. The method for manufacturing the semiconductor device as claimed in claim 1,
   wherein the patterned photoresist layer has a photoresist opening, wherein a position of the photoresist opening corresponds to a position of the openings, and a diameter of the photoresist opening is larger than a diameters of the openings.

3. The method for manufacturing the semiconductor device as claimed in claim 1, wherein the insulating layer has a first thickness T1, wherein after the first etching step and before the second etching step, each of the openings has a first depth D1, and wherein a ratio T1/D1 of the first thickness T1 to the first depth D1 is 1.0-2.0.

4. The method for manufacturing the semiconductor device as claimed in claim 1, wherein after the first etching step and before the second etching step, a minimum distance S1 between bottom surfaces of the openings and a top surface of the barrier layer is 50-500 nm.

5. The method for manufacturing the semiconductor device as claimed in claim 1, wherein performing the third etching step comprises:
   after removing the gap-filling layer at the bottoms of the openings, using the barrier layer as an etch stop layer to increase a depth of a bottom surface of the trench and a depth of bottom surfaces of the openings; and
   removing the barrier layer exposed by the openings to expose the metal layer, wherein the depth of the bottom surface of the trench is deepened again when the barrier layer is removed.

6. The method for manufacturing the semiconductor device as claimed in claim 1, wherein the metal layer has a first thermal expansion coefficient, the barrier layer has a second thermal expansion coefficient, and a ratio of the first thermal expansion coefficient to the second thermal expansion coefficient is 9.0-15.0.

7. The method for manufacturing the semiconductor device as claimed in claim 1, wherein the second vias are formed in the third etching step, and a ratio of an etching rate of the insulating layer to an etching rate of the barrier layer is 0.5-3.0.

8. The method for manufacturing the semiconductor device as claimed in claim 1, wherein the second vias are formed in a fourth etching step after the third etching step, wherein during the third etching step, a ratio of an etching rate of the insulating layer to an etching rate of the barrier layer is 3.0-20.0, and wherein during the fourth etching step, a ratio of an etching rate of the barrier layer to an etching rate of the insulating layer is 3.0-20.0.

9. The method for manufacturing the semiconductor device as claimed in claim 1, wherein before the third etching step, the trench has a second depth D2, wherein after the third etching step, the trench has a third depth D3, and wherein a ratio D3/D2 of the third depth D3 to the second depth D2 is 1.2-2.0.

10. The method for manufacturing the semiconductor device as claimed in claim 1, wherein after forming the insulating layer, the metal layer has a plurality of protrusions, and the openings are located above at least one of the protrusions.

11. The method for manufacturing the semiconductor device as claimed in claim 10, further comprising:
    after forming the insulating layer, measuring a height of each of the protrusions, wherein the protrusions have a maximum height H1; and
    determining a first depth D1 of each of the openings after the first etching step according to the maximum height H1.

12. The method for manufacturing the semiconductor device as claimed in claim 11, wherein after the first etching step, a minimum distance S1 is between a bottom surface of each of the openings and a top surface of the barrier layer, and a ratio S1/H1 of the minimum distance S1 to the maximum height H1 is 0.5-5.0.

13. The method for manufacturing the semiconductor device as claimed in claim 10, wherein one of the plurality of the protrusions directly under the openings has an area larger than an area of a corresponding one of the openings.

* * * * *